(12) United States Patent
Takahashi et al.

(10) Patent No.: US 11,433,667 B2
(45) Date of Patent: Sep. 6, 2022

(54) LIQUID EJECTION HEAD AND METHOD OF MANUFACTURING THE SAME

(71) Applicant: CANON KABUSHIKI KAISHA, Tokyo (JP)

(72) Inventors: Tomohiro Takahashi, Yokohama (JP); Toru Nakakubo, Kawasaki (JP); Akio Saito, Machida (JP); Takeyori Sato, Kawasaki (JP); Katsumi Eda, Hino (JP); Takeshi Shibata, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 224 days.

(21) Appl. No.: 16/844,632

(22) Filed: Apr. 9, 2020

(65) Prior Publication Data

US 2020/0331271 A1 Oct. 22, 2020

(30) Foreign Application Priority Data

Apr. 22, 2019 (JP) .............................. JP2019-080839

(51) Int. Cl.

| B41J 2/14 | (2006.01) |
|---|---|
| B41J 2/16 | (2006.01) |
| H05K 1/03 | (2006.01) |
| H01L 21/02 | (2006.01) |
| H01L 21/683 | (2006.01) |

(52) U.S. Cl.
CPC ....... *B41J 2/14072* (2013.01); *B41J 2/14024* (2013.01); *B41J 2/1623* (2013.01); *H01L 21/02002* (2013.01); *H01L 21/6836* (2013.01); *H05K 1/0393* (2013.01); *B41J 2002/14491* (2013.01); *B41J 2202/20* (2013.01)

(58) Field of Classification Search
CPC .. B41J 2/1623; B41J 2/14072; B41J 2/14024; B41J 2002/14491; B41J 2202/20; H01L 21/6836; H05K 1/0393
See application file for complete search history.

(56) References Cited

U.S. PATENT DOCUMENTS

| RE32,572 | E  * | 1/1988 | Hawkins | ................ B41J 2/1604 216/2 |
|---|---|---|---|---|
| 5,204,690 | A  * | 4/1993 | Lorenze, Jr. | ........... B41J 2/1604 216/2 |
| 6,315,403 | B1 * | 11/2001 | Shinozaki | ................ B41J 2/005 347/100 |
| 6,318,843 | B1 * | 11/2001 | Feder | ................... B41J 2/14024 347/47 |
| 6,705,705 | B2 * | 3/2004 | Horvath | ............... B41J 2/14024 347/50 |

(Continued)

FOREIGN PATENT DOCUMENTS

| CN | 101092080 A | 12/2007 |
|---|---|---|
| CN | 108724941 A | 11/2018 |

(Continued)

*Primary Examiner* — Henok D Legesse
(74) *Attorney, Agent, or Firm* — Canon U.S.A., Inc. I.P. Division

(57) ABSTRACT

A recording element substrate is bonded to an FPC in at least a part of a region of a second face between a liquid supply port and an edge of the recording element substrate, and an electric connection part is provided in which a wiring conductor and a pad are electrically connected to each other by a bonding wire.

15 Claims, 10 Drawing Sheets

(56) References Cited

U.S. PATENT DOCUMENTS

| | | | | |
|---|---|---|---|---|
| 7,533,960 | B2* | 5/2009 | Yasuda | B41J 2/14072 347/40 |
| 7,775,638 | B2* | 8/2010 | Hirosawa | B41J 2/1603 347/58 |
| 7,832,818 | B1* | 11/2010 | McElfresh | B41J 2/14072 347/5 |
| 8,602,527 | B2* | 12/2013 | Petersen | B41J 2/14072 347/44 |
| 2006/0132545 | A1 | 6/2006 | Tanikawa | |
| 2006/0221133 | A1 | 10/2006 | Harada et al. | |
| 2008/0143788 | A1 | 6/2008 | Toge et al. | |
| 2008/0170102 | A1* | 7/2008 | Kim | B41J 2/1601 347/50 |
| 2008/0174639 | A1* | 7/2008 | Park | B41J 2/1629 347/65 |
| 2014/0320568 | A1* | 10/2014 | Lee | B41J 2/1623 347/68 |
| 2015/0210077 | A1 | 7/2015 | Tomizawa et al. | |
| 2019/0383610 | A1* | 12/2019 | Torimoto | B81C 3/001 |
| 2021/0231842 | A1* | 7/2021 | Sullivan | G02B 5/0294 |

FOREIGN PATENT DOCUMENTS

| | | |
|---|---|---|
| JP | H11-010894 A | 1/1999 |
| JP | 2006056243 A | 3/2006 |
| JP | 2008120056 A | 5/2008 |

* cited by examiner

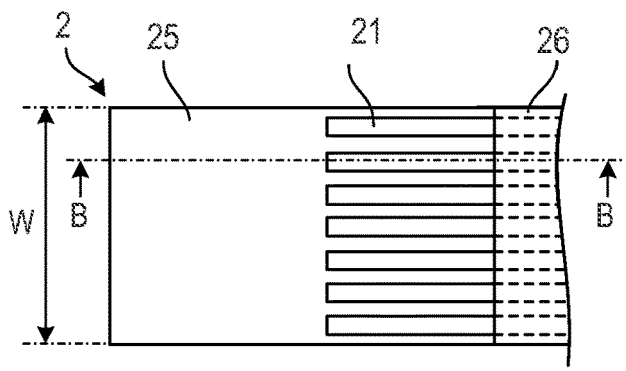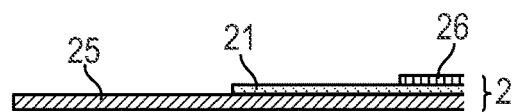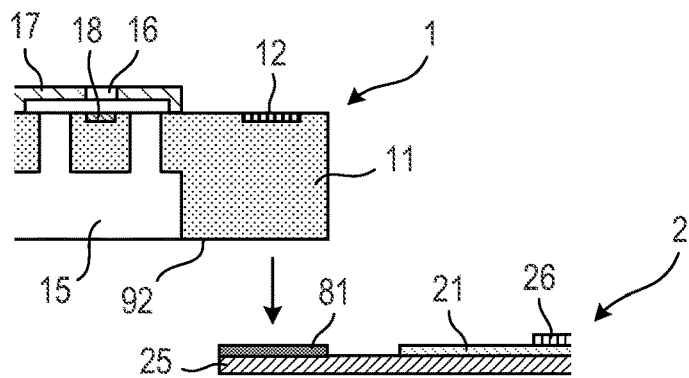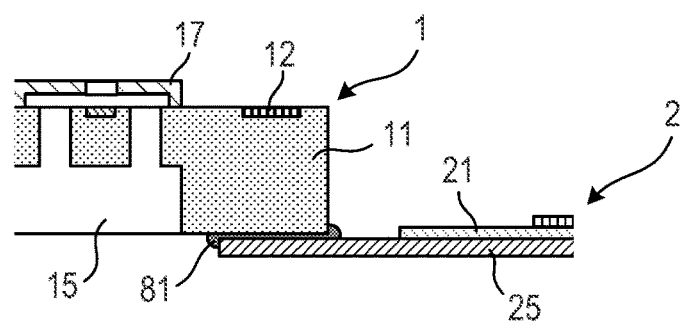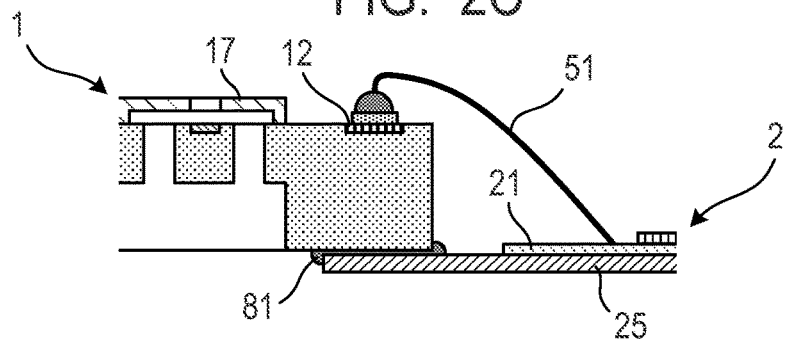

FIG. 6
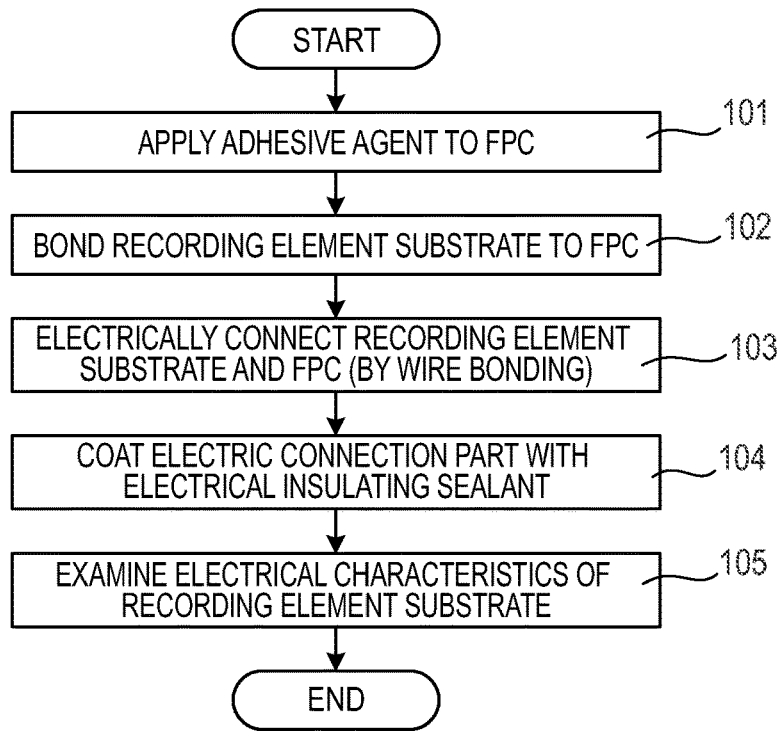
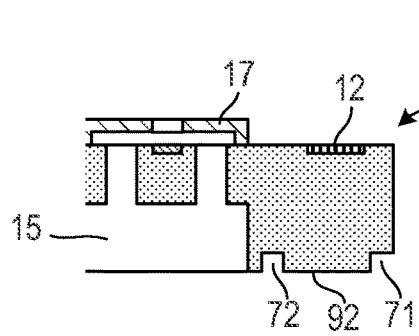
FIG. 7A
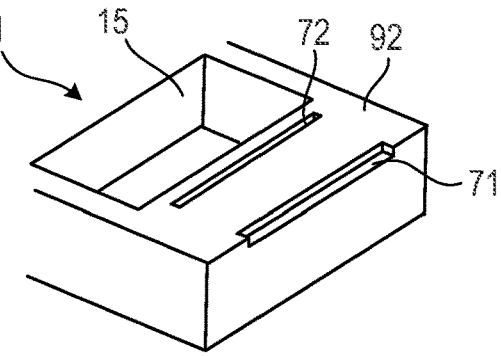
FIG. 7B
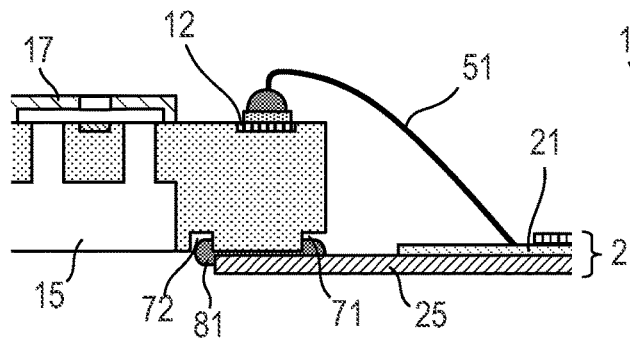
FIG. 8A
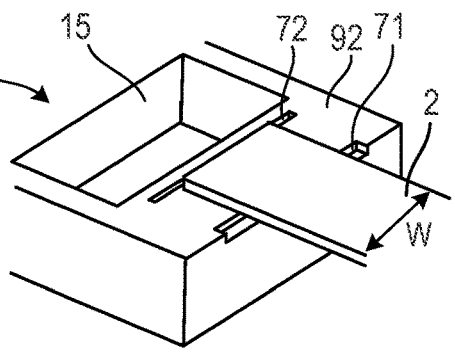
FIG. 8B

LIQUID EJECTION HEAD AND METHOD OF MANUFACTURING THE SAME

BACKGROUND OF THE DISCLOSURE

Field of the Disclosure

The present disclosure relates to a liquid ejection head having an ejection orifice for ejecting a liquid, such as an ink, and a method of manufacturing the same.

Description of the Related Art

A liquid ejection apparatus is provided with a liquid ejection head for ejecting a liquid, such as an ink, onto a recording medium or the like. The liquid ejection head includes a large number of ejection orifices for ejecting a liquid, and recording elements each of which is provided for a corresponding one of the ejection orifices. The recording elements are often formed on a first face of a recording element substrate formed by a semiconductor substrate, for example. The recording element substrate is referred to also as a semiconductor chip. An electric circuit for driving the recording elements can also be provided on the same recording element substrate as the recording elements. The liquid ejection apparatus transmits an electric signal that triggers liquid ejection to the recording element substrate mounted on the liquid ejection head. To this end, a flexible electric wiring substrate with flexibility, such as a flexible printed circuit (FPC) and a tape automated bonding (TAB) circuit, is connected to the recording element substrate. Furthermore, the liquid ejection head has a liquid supply path, which is a through-hole penetrating the recording element substrate from a second face to the first face, formed to supply the liquid to be ejected to the positions of the recording elements. The liquid supply path opens on the second face of the recording element substrate to provide a liquid supply port.

As a process of connecting an electric wiring substrate and a recording element substrate to each other, Japanese Patent Application Laid-Open No. 2008-120056 discloses a process of separately bonding a recording element substrate and an electric wiring substrate onto a support member and then electrically bonding the recording element substrate and the electric wiring substrate by wire bonding using a gold (Au) wire. Japanese Patent Application Laid-Open No. 2006-56243 discloses a process of providing through-wiring that passes through a recording element substrate to route electric wiring from a recording element to a second face of the recording element substrate and bonding an electrode formed on the second face and an electric wiring substrate with a metal bump, thereby establishing an electric connection.

According to the process described in Japanese Patent Application Laid-Open No. 2008-120056, the recording element substrate and the electric wiring substrate are electrically connected to each other after the recording element substrate and the electric wiring substrate are bonded to the support member, and the electrical characteristics of the recording element substrate can only be examined after the electric connection is established. If a defective recording element substrate is found in the examination of the electrical characteristics, not only the recording element substrate and the electric wiring substrate but also the support member to which they are bonded have to be discarded, and the total manufacturing cost may increase. The process described in Japanese Patent Application Laid-Open No. 2006-56243 requires formation of through-wiring that passes through the recording element substrate formed by a semiconductor substrate and coating of the surface of the through-hole for the through-wiring with a conductive material, and therefore requires many additional processing steps and an increased processing cost. In addition, since the liquid supply port is formed on the second face of the recording element substrate, the pad and electrode on the recording element substrate and the wiring on the electric wiring substrate arranged on the side of the second face are close to each other if the electric connection is established on the second face. Therefore, an adhesive agent used to bond the recording element substrate and the electric wiring substrate to each other and a sealant used to protect the electric connection part may overflow to the liquid supply port and block the liquid supply port. Since the electric connection part and the liquid supply port are close to each other, the risk of such liquids coming into contact with the electric connection part and the like and causing corrosion of the electric wiring may increase.

SUMMARY OF THE DISCLOSURE

An aspect of the present disclosure is to provide a liquid ejection head in which a recording element substrate and an electric wiring substrate can be electrically connected to each other without being bonded to a support member while keeping a distance between an electric connection part between the recording element substrate and the electric wiring substrate and a liquid supply port. Another aspect is to provide a method of manufacturing the same.

A liquid ejection head according to the present disclosure is a liquid ejection head including: a recording element substrate including a pad for electric connection formed on a first face and a liquid supply port formed on a second face, which is opposite to the first face; and a flexible electric wiring substrate including a wiring conductor, wherein the recording element substrate is bonded to the flexible electric wiring substrate in at least a part of a region of the second face between the liquid supply port and an edge of the recording element substrate, and the liquid ejection head has an electric connection part in which the wiring conductor and the pad are electrically connected to each other by a bonding wire.

Further features and aspects of the present disclosure will become apparent from the following description of example embodiments with reference to the attached drawings.

BRIEF DESCRIPTION OF THE DRAWINGS

FIG. 1A is a diagram for illustrating an example flexible printed circuit (FPC).

FIG. 1B is a diagram for illustrating the flexible printed circuit (FPC).

FIG. 2A is a schematic cross-sectional view for illustrating a liquid ejection head according to a first example embodiment.

FIG. 2B is a schematic cross-sectional view for illustrating the liquid ejection head according to the first example embodiment.

FIG. 2C is a schematic cross-sectional view for illustrating the liquid ejection head according to the first example embodiment.

FIG. 6 is a flowchart illustrating an example process of manufacturing the liquid ejection head.

FIG. 7A is a diagram illustrating a recording element substrate according to a second example embodiment.

FIG. 7B is a diagram illustrating the recording element substrate according to the second example embodiment.

FIG. 8A is a diagram for illustrating bonding of the recording element substrate and an FPC.

FIG. 8B is a diagram for illustrating the bonding of the recording element substrate and the FPC.

DESCRIPTION OF THE EMBODIMENTS

Figure 3:
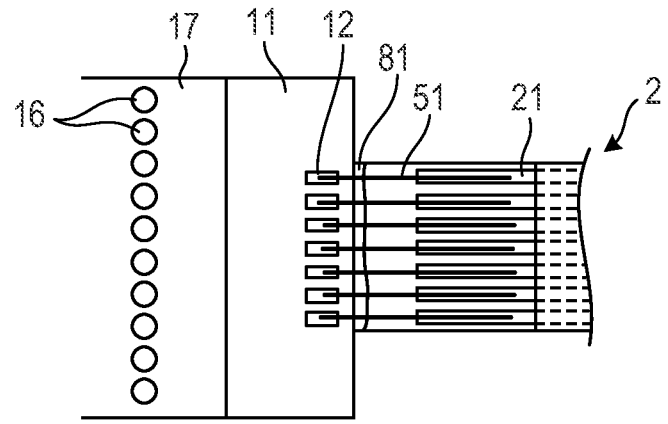
FIG. 3 is a plan view for illustrating the liquid ejection head according to the first example embodiment.

Numerous embodiments, features and aspects of the present disclosure will now be described in detail in accordance with the accompanying drawings.

In the following, embodiments of the present disclosure will be described with reference to the drawings. Before describing a liquid ejection head according to the present disclosure, a flexible electric wiring substrate used in the embodiments described below will be first described. Although the flexible electric wiring substrate may be any of a flexible printed circuit (FPC) and a TAB circuit, FPC will be described below. FIGS. 1A and 1B are diagrams illustrating a configuration of an FPC. FIG. 1A is a plan view, and FIG. 1B is a cross-sectional view taken along the line B-B in FIG. 1A. In FIGS. 1A and 1B, the horizontal direction corresponds to the longitudinal direction of an FPC 2, which is a flexible electric wiring substrate 2, and the FPC 2 is oriented with a leading end part thereof pointing to the left.

The FPC 2 has a plurality of wiring conductors 21 formed in parallel with each other on (a third face of) an elongated base film 25 (base material), which is made of a polyimide resin and the like. The plurality of wiring conductors 21 forms a single wiring layer as a whole, and each wiring conductor 21 is formed by patterning a copper (Cu) foil and the like. The wiring conductor 21 is covered with a cover film 26, which is made of a polyimide and the like, except for a part electrically connected to the recording element substrate 1, that is, a part that needs to be exposed. The base film 25 and the wiring conductor 21 are bonded to each other by an adhesive film (not shown) and the like, and the wiring conductor 21 and the cover film 26 are also bonded to each other by an adhesive film (not shown) and the like. The dimension of the FPC 2 in the direction perpendicular to the longitudinal direction (that is, the direction in which the wiring conductors 21 extend) will be referred to as a width W. Although the FPC 2 illustrated in FIGS. 1A and 1B has a single wiring layer, the FPC 2 according to the present disclosure may have a plurality of wiring layers stacked with insulating layers interposed therebetween.

First Example Embodiment

FIGS. 2A to 2C are schematic cross-sectional views illustrating a configuration of a liquid ejection head according to a first embodiment of the present disclosure. FIGS. 2A to 2C sequentially illustrate different steps of a process of electrically connecting the FPC 2 to the recording element substrate 1. The recording element substrate 1 mounted on the liquid ejection head according to the first embodiment is formed by a silicon (Si) substrate 11, and an ejection orifice forming member 17 is arranged on a first face of the recording element substrate 1, that is, a first face of the silicon substrate 11. The ejection orifice forming member 17 has a plurality of ejection orifices 16 in the form of through-holes. At the parts where the ejection orifices 16 are formed, the ejection orifice forming member 17 is spaced apart from the first face of the silicon substrate 11, and a space referred to as a pressure chamber is formed between the ejection orifice forming member 17 and the silicon substrate 11. The ejection orifice forming member 17 comes into contact with the liquid to be ejected, such as an ink, and therefore the material forming the ejection orifice forming member 17 needs to be resistant to the ejected liquid. For the liquid ejection head that ejects an ink through the ejection orifices 16, the ejection orifice forming member 17 may be made of a photosensitive resin having an ink resistance.

To supply a liquid to the ejection orifices 16 across the pressure chamber described above, a liquid supply path is formed in the silicon substrate 11 in the form of a through-hole extending from a second face to the first face. The opening of the liquid supply path 15 on the second face are referred to as a liquid supply port. The second face of the silicon substrate 11 is a face opposite to the first face of the silicon substrate 11 and is the same as a second face 92 of the recording element substrate 1. On the first face of the silicon substrate 11, recording elements 18, which produce energy that causes ejection of the liquid, are formed at locations opposed to the ejection orifices 16. The recording element 18 produces thermal energy in response to a signal, and imparts the thermal energy to the liquid in the pressure chamber to cause part of the liquid to be foamed and ejected through the ejection orifices 16. A pad 12 used for externally input an electric signal to the recording element substrate 1 is formed on the first face of the silicon substrate 11 in an end part where the ejection orifice forming member 17 is not disposed.

An electric signal that triggers ejection of the liquid from the liquid ejection head is transmitted from a main unit of the liquid ejection apparatus to the recording element substrate 1. To this end, the FPC 2 described above is electrically connected to the recording element substrate 1. Before establishing the electrical connection between the recording element substrate 1 and the FPC 2, the recording element substrate 1 is mechanically bonded to the FPC 2 as illustrated in FIG. 2A. The bonding can be achieved with one of an adhesive agent and a bonding film, for example. In this example, an ultraviolet (UV) curable epoxy adhesive agent is used. An adhesive agent 81 is applied to a region at the leading end of the FPC 2 where no wiring conductor 21 is formed, that is, a part where the base film 25 is exposed, the applied adhesive agent 81 is irradiated with ultraviolet rays, and then the recording element substrate 1 is brought into contact with and pressed against the FPC 2. The adhesive agent 81 then sets, and the recording element substrate 1 is mechanically bonded to the FPC 2 as illustrated in FIG. 2B. In this bonded state, the FPC 2 is bonded to the recording element substrate 1 at the face that is parallel with the longitudinal direction in the leading end part thereof, and the recording element substrate 1 is bonded to the FPC 2 at the part between the liquid supply port and the end of the recording element substrate 1. That is, the part of the second face 92 of the recording element substrate 1 between the liquid supply port and the edge of the recording element substrate 1 and the third face of the base film 25 of the FPC 2 are bonded to each other. If any wiring conductor 21 of the FPC 2 comes into direct contact with the recording element substrate 1, an electrical short (short circuit) occurs. To avoid this, the tip ends of the wiring conductors 21 are retracted from the leading end of the FPC 2 toward the root of the FPC 2, thereby ensuring a positional relationship that the wiring conductors 21 and the recording element substrate 1 do not come into contact with each other. Specifically, the tip ends of the wiring conductors 21 on the FPC 2 are positioned closer to the root of the FPC 2 in the longitudinal direction than the outer circumference of the recording element substrate 1 is. However, this does not hold true for any wiring conductor 21 that is not energized when the product is used as a liquid ejection head and cannot be short-circuited, and such a wiring conductor 21 can be in contact with the recording element substrate 1. In order to prevent the FPC 2 bonded to the recording element substrate 1 from interfering with the supply of the liquid to the liquid supply path 15, the FPC 2 and the recording element substrate 1 are arranged in a positional relationship that the bonded FPC 2 does not cover the liquid supply port of the liquid supply path 15. Specifically, on the second face 92 of the recording element substrate 1, the leading end of the FPC 2 is positioned between the end of the recording element substrate 1 and the liquid supply port.

As illustrated in FIG. 2C, the pads 12 for electrical connection formed on the first face of the silicon substrate 11 and the wiring conductor 21 of the FPC 2 are then electrically connected to each other by wire bonding. As a process of wire bonding, there are ball bonding using gold wire and wedge bonding using aluminum (Al) wire. In the example illustrated, the electrical connection is achieved by ball bonding using a bonding wire 51 made of gold having a diameter of 25 µm. FIG. 3 is a plan view of the recording element substrate 1 and the FPC 2 connected by wire bonding. The bonding wires 51, the pads 12 on the recording element substrate 1 and the exposed wiring conductors 21 form an electric connection part for the recording element substrate 1 and the FPC 2, and an electrical insulating sealant (sealing agent) 90 is applied to the electric connection part.

Figure 4:
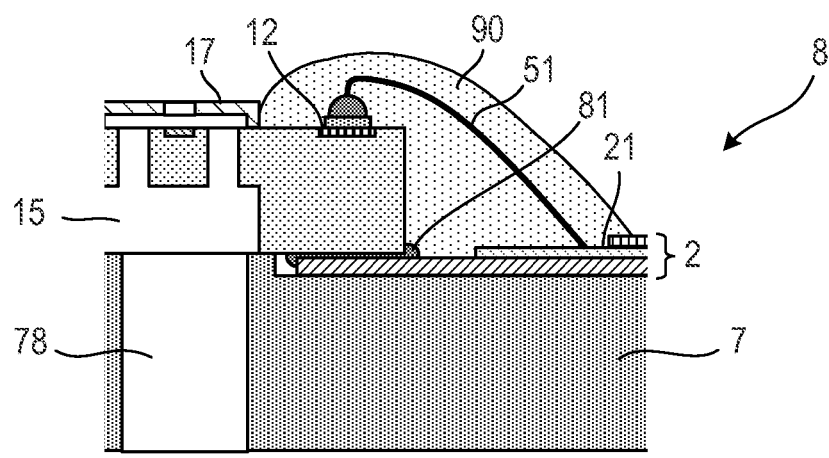
FIG. 4 is a schematic cross-sectional view for illustrating essential parts of the liquid ejection head according to the first example embodiment.
Figure 5:
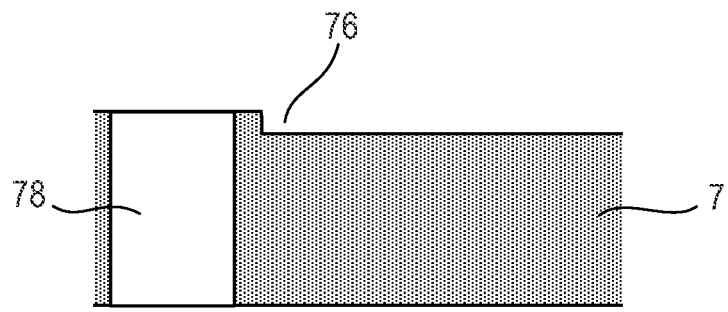
FIG. 5 is a schematic cross-sectional view of an example flow path member.

After the recording element substrate 1 and the FPC 2 are electrically connected to each other, an electric signal is fed to the recording element substrate 1 through the FPC 2 to examine the electrical characteristics of the recording element substrate 1 to check whether the recording element substrate 1 has any electric failure. After confirming that there is no electrical failure, the assembly of the recording element substrate 1 and the FPC 2 is bonded to a flow path member 7, thereby completing a liquid ejection head 8 as illustrated in FIG. 4. The flow path member 7 is a member in which a flow path 78 for supplying the liquid to the liquid supply path 15 of the recording element substrate 1 is formed. The flow path member 7 is bonded to the second face 92 of the recording element substrate 1. There is a level difference between the second face 92 of the recording element substrate 1 and the surface of the FPC 2 on the side of the base film 25. In order to prevent the assembly of the recording element substrate 1 and the FPC 2 from being inclined with respect to the flow path member 7 despite the level difference when the assembly is bonded to the flow path member 7, a step part 76, which is a recess, is formed on the surface of the flow path member 7 as illustrated in FIG. 5. The step part 76 is formed at a location where the step part 76 is opposed to the FPC 2 when the assembly is bonded to the flow path member 7, and the step part 76 has a depth comparable to the thickness of the base film 25 of the FPC 2, since the thickness of the adhesive agent 81 can be ignored.

According to this embodiment, in a state where the recording element substrate 1 and the FPC 2 are not bonded to any support member, the recording element substrate 1 and the FPC 2, which is flexible electric wiring substrate, can be electrically connected to each other, and the electrical characteristics of the recording element substrate 1 can be examined. The wiring conductors 21 of the FPC 2 are positioned on the outer side of the outer circumference of the recording element substrate 1 and sufficiently spaced apart from the liquid supply port of the liquid supply path 15, and therefore the possibility that the liquid comes into contact with the electric connection part can be reduced. Note that, if the electric connection is established when the recording element substrate 1 and the FPC 2 are yet to be bonded to each other, the electrically connected recording element substrate 1 and FPC are difficult to handle in the subsequent manufacturing steps. According to this embodiment, even though the recording element substrate 1 and the FPC 2 are electrically connected to each other in a state where the two are not connected to any support member, the recording element substrate 1 and the FPC 2 can be easily handled in the subsequent manufacturing steps since the recording element substrate 1 and the FPC 2 are already bonded to each other. Furthermore, in this embodiment, in the plane view of the liquid ejection head, the pads 12 and the bonding area between the recording element substrate 1 and the FPC 2 overlap with each other. However, the pads 12 and the bonding area do not have to be overlap. Nevertheless, if the pads 12 and the bonding area between the recording element substrate 1 and the FPC 2 overlap with each other as in this embodiment, the bonding area serves as a support during wire bonding. Therefore, in the plan view of the liquid ejection head, the pads 12 and the bonding area between the recording element substrate 1 and the FPC 2 can at least partially overlap with each other.

FIG. 6 is a flowchart illustrating the above-described procedure of electrically connecting the recording element substrate 1 and the FPC 2 to each other. First, in Step 101, the adhesive agent 81 is applied to the part at the leading end of the FPC 2 where no wiring conductor 21 is formed as described above, and then in Step 102, the recording element substrate 1 is bonded onto the FPC 2 by the adhesive agent 81. In Step 103, the pads 12 of the recording element substrate 1 and the wiring conductors 21 of the FPC 2 are then electrically connected to each other by wire bonding, and then in Step 104, the electric connection part is coated with an electrical insulating sealant 90. Finally, the electrical characteristics of the recording element substrate 1 are examined through the FPC 2, and the flow path member 7 is bonded to any of the assemblies produced as described above that has passed the examination, thereby completing the liquid ejection head 8.

Second Example Embodiment

Next, a liquid ejection head according to a second embodiment of the present disclosure will be described. In the first embodiment described above, the UV curable adhesive agent 81 is used to mechanically bond the recording element substrate 1 and the FPC 2 to each other. Before the adhesive agent 81 sets, the adhesive agent 81 is liquid. Therefore, when the recording element substrate 1 is pressed against the FPC 2, the adhesive agent 81 can be squeezed out between the recording element substrate 1 and the FPC 2, and flow into the liquid supply path 15 through the liquid supply port or adhere to any exposed wiring conductor 21 of the FPC 2. If the adhesive agent 81 flows into the liquid supply path 15, the adhesive agent 81 interferes with the supply of the liquid to the first face of the recording element substrate 1 and thus interferes with the ejection of the liquid from the ejection orifices 16. If the adhesive agent 81 adheres to the wiring conductors 21, the recording element substrate 1 and the FPC 2 cannot be electrically connected to each other by wire bonding. The liquid ejection head according to the second embodiment, which is basically the same as the liquid ejection head according to the first embodiment, differs from the liquid ejection head according to the first embodiment in that any of a groove and a notch is formed in the second face 92 of the recording element substrate 1 in order to prevent the adhesive agent 81 from being squeezed out and causing the failure described above.

FIGS. 7A and 7B are diagrams illustrating the recording element substrate 1 used in the liquid ejection head according to the second embodiment. FIG. 7A is a schematic cross-sectional view, and FIG. 7B is a perspective view of the second face 92. According to this embodiment, in order to prevent the adhesive agent 81 from flowing into the liquid supply path 15, a groove 72 is formed in the second face 92 of the recording element substrate 1 at a location close to the liquid supply port of the liquid supply path 15 between the liquid supply port and the end of the recording element substrate 1. Specifically, the groove 72 is formed in parallel with the outer edge of the liquid supply port at a location that will be between the liquid supply port and the FPC 2 when the FPC 2 is bonded to the second face 92 of the recording element substrate 1. In order to prevent the adhesive agent 81 from adhering to any exposed wiring conductor 21 of the FPC 2, a notch 71 is formed in the outer edge of the recording element substrate 1 in a part where the FPC 2 crosses the recording element substrate 1, that is, in a ridge of the end of the recording element substrate 1. The notch 71 is formed to provide a level difference at the ridge. Both the notch 71 and the groove 72 can have a length greater than the width W of the FPC 2.

FIGS. 8A and 8B are diagrams for illustrating bonding of the recording element substrate 1 and the FPC 2 of the liquid ejection head according to the second embodiment. FIG. 8A is a schematic cross-sectional view, and FIG. 8B is a perspective view of the recording element substrate 1 viewed from the side of the second face 92. The tip ends of the wiring conductors 21 are retracted from the leading end of the FPC 2, and as illustrated in FIG. 8A, the adhesive agent 81 is applied onto the base film 25 in a region of the leading end part of the FPC 2 where no wiring conductor 21 is formed, thereby bonding the recording element substrate 1 and the FPC 2 to each other. In this process, the adhesive agent 81 is squeezed out between the recording element substrate 1 and the FPC 2 because the recording element substrate 1 is pressed against the FPC 2. However, the adhesive agent 81 squeezed out flows into the groove 72 and therefore does not flow into the liquid supply port. In addition, any adhesive agent 81 squeezed out toward the end of the recording element substrate 1 is retained in the space defined by the notch 71 and the base film 25 and does not override and adhere to any exposed wiring conductor 21. Although both the notch 71 and the groove 72 are formed in the second face 92 of the recording element substrate 1 in this embodiment, only one of the notch 71 and the groove 72 may be provided as required.

Figure 9A:
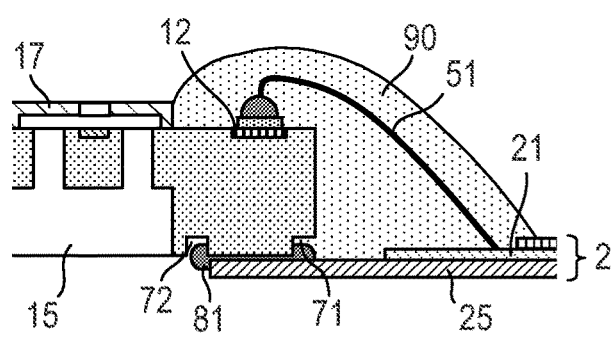
FIG. 9A is a diagram for illustrating a liquid ejection head according to the second example embodiment.
Figure 9B:
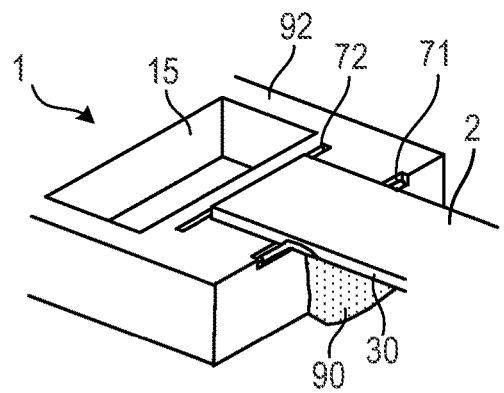
FIG. 9B is a diagram for illustrating the liquid ejection head according to the second example embodiment.

With the liquid ejection head according to the first embodiment described earlier, after the electric connection between the recording element substrate 1 and the FPC 2 is established, the electrical insulating sealant 90 is applied to the electric connection part. The sealant 90 is also a liquid material. Therefore, when the sealant 90 is applied to cover the electric connection part, the sealant 90 may overflow to the second face 92 of the recording element substrate 1 along the surface of the FPC 2 and flow into the liquid supply path 15 through the liquid supply port. If the sealant 90 flows into the liquid supply path 15, the sealant 90 interferes with the supply of the liquid to the first face of the recording element substrate 1, as in the case where the adhesive agent 81 flows into the liquid supply path 15. FIGS. 9A and 9B are diagrams for illustrating the liquid ejection head with the electric connection part covered with the sealant 90 according to the second embodiment. FIG. 9A is a schematic cross-sectional view, and FIG. 9B is a perspective view of the recording element substrate 1 viewed from the side of the second face 92. In the second embodiment, again, the sealant 90 tends to overflow to the second face 92 of the recording element substrate 1 along a side edge part 30 of the FPC 2 as illustrated in FIG. 9B. According to the second embodiment, however, the sealant 90 is trapped in the space defined by the notch 71 and the base film 25 before overflowing to the second face 92, and thus the sealant 90 is prevented from overflowing to the second face 92. Therefore, the sealant 90 does not reach the liquid supply port of the liquid supply path 15, as with the adhesive agent 81.

Third Example Embodiment

Figure 10A:
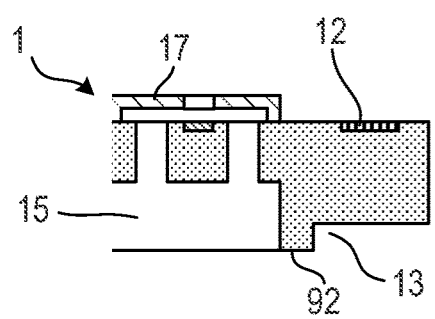
FIG. 10A is a diagram illustrating a recording element substrate according to a third example embodiment.
Figure 10B:
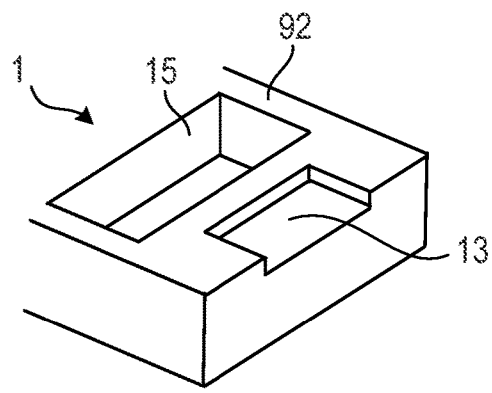
FIG. 10B is a diagram illustrating the recording element substrate according to the third example embodiment.

Next, a liquid ejection head according to a third embodiment of the present disclosure will be described. FIGS. 10A and 10B are diagrams for illustrating the recording element substrate 1 of the liquid ejection head according to the third embodiment. FIG. 10A is a schematic cross-sectional view, and FIG. 10B is a perspective view of the recording element substrate 1 viewed from the side of the second face 92. In the first embodiment, the step part 76 is provided in the flow path member 7 to prevent the assembly of the recording element substrate 1 and the FPC 2 from being inclined when the assembly is bonded to the flow path member 7. According to the third embodiment, instead of providing the step part 76 in the flow path member 7, a recess part 13 is provided in the second face 92 of the recording element substrate 1 at a part where the FPC 2 is to be bonded to the recording element substrate 1. The recess part 13 has a depth comparable to the thickness of the base film 25 of the FPC 2, since the thickness of the adhesive agent 81 can be ignored. The outer circumference of the recess part 13 is shaped to be just enough to accommodate the leading end part of the FPC 2 or to be larger than that.

Figure 11A:
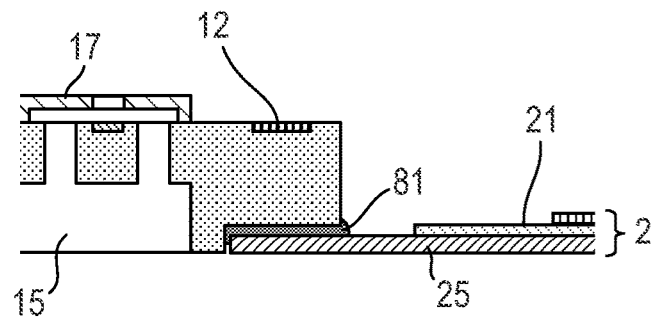
FIG. 11A is a diagram for illustrating bonding of the recording element substrate and the FPC.
Figure 11B:
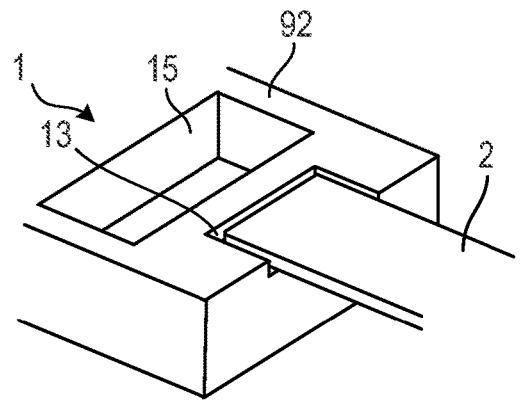
FIG. 11B is a diagram for illustrating the bonding of the recording element substrate and the FPC.
Figure 12:
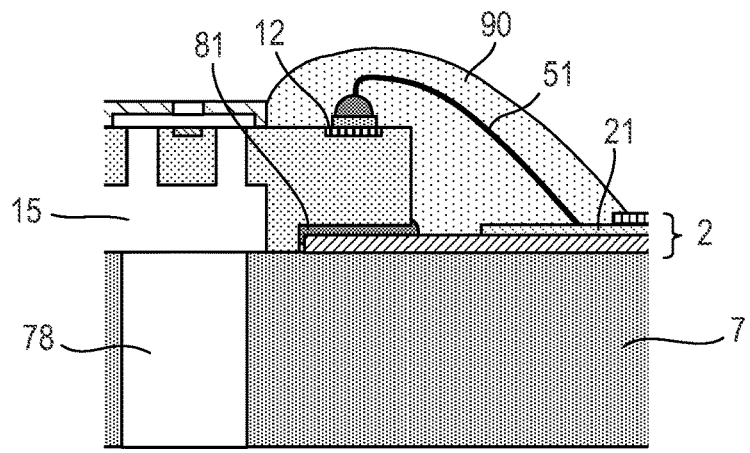
FIG. 12 is a diagram for illustrating a liquid ejection head according to the third example embodiment.
Figure 13:
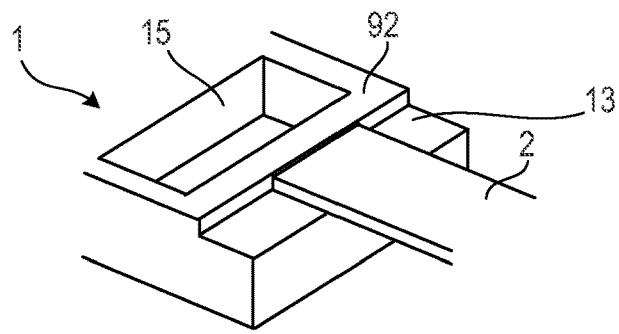
FIG. 13 is a perspective view illustrating another example of the recording element substrate according to the third example embodiment.

FIGS. 11A and 11B are diagrams for illustrating bonding between the recording element substrate 1 and the FPC 2 of the liquid ejection head according to the third embodiment. FIG. 11A is a schematic cross-sectional view, and FIG. 11B is a perspective view of the recording element substrate 1 viewed from the side of the second face 92. As in the first and second embodiments, the adhesive agent 81 is applied onto the base film 25 of the FPC 2, and the recording element substrate 1 is pressed against the FPC 2 to connect the recording element substrate 1 and the FPC 2 to each other. In this embodiment, the second face 92 of the recording element substrate 1 and the surface (the face opposite to the face in contact with the wiring conductors 21) of the base film of the FPC 2 are substantially flush with each other, and there is little level difference between the second face 92 and the surface of the base film. Therefore, the assembly of the recording element substrate 1 and the FPC 2 can be bonded to the flow path member 7 without being inclined, even if the step part 76 (see FIG. 5) is not provided in the flow path member 7. FIG. 12 is a cross-sectional view of essential parts of the liquid ejection head completed in this way including the electric connection part. In FIGS. 10A and 10B, the recess part 13 is shaped in conformity with the shape of the FPC 2, and the leading end part of the FPC 2 is surrounded by the side walls of the silicon substrate 11 resulting from the formation of the recess part 13. However, the shape of the recessed portion is not limited thereto. As illustrated in FIG. 13, a recess part 13 may be formed in an end part of the recording element substrate 1 across the width between the two sides of the recording element substrate 1 on the opposite sides of the end part.

Fourth Example Embodiment

Figure 14A:
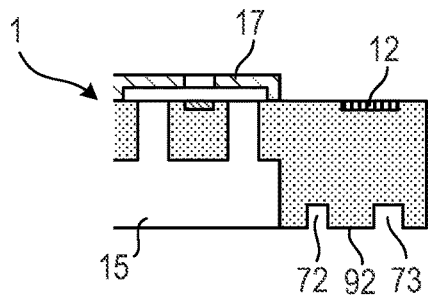
FIG. 14A is a diagram for illustrating a liquid ejection head according to a fourth example embodiment.
Figure 14B:
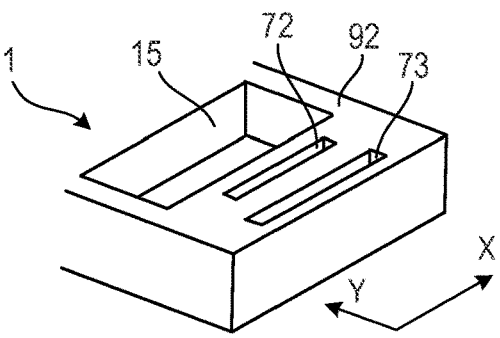
FIG. 14B is a diagram for illustrating the liquid ejection head according to the fourth example embodiment.
Figure 14C:
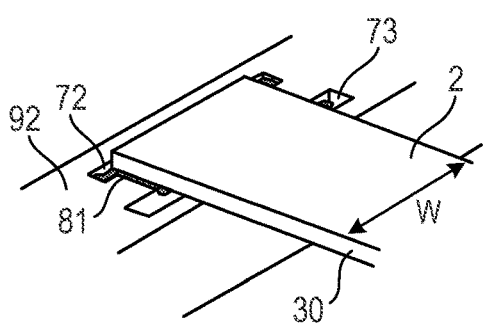
FIG. 14C is a diagram for illustrating the liquid ejection head according to the fourth example embodiment.
Figure 14D:
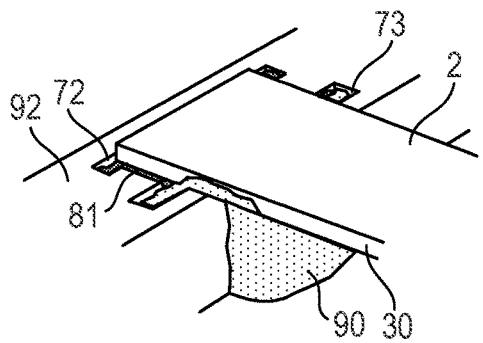
FIG. 14D is a diagram for illustrating the liquid ejection head according to the fourth example embodiment.

Next, a liquid ejection head according to a fourth embodiment will be described. FIGS. 14A to 14D are diagrams for illustrating the liquid ejection head according to this embodiment. FIG. 14A is a schematic cross-sectional view of the recording element substrate 1, and FIG. 14B is a perspective view of the recording element substrate 1 viewed from the side of the second face. FIG. 14C is a perspective view of the liquid ejection head with the FPC 2 bonded to the recording element substrate 1 by the adhesive agent 81, and FIG. 14D is a perspective view of the liquid ejection head with the sealant 90 applied thereto. According to the second embodiment, the notch 71 and the groove 72 are formed in the second face 92 of the recording element substrate 1, and any adhesive agent 81 squeezed out is accommodated in the notch 71 and the groove 72. According to the fourth embodiment, a groove 73 is formed in the second face 92 instead of the notch 71. In short, two grooves 72 and 73 are formed in the second face 92 of the recording element substrate 1 between the liquid supply port of the liquid supply path 15 and the end of the recording element substrate 1. The grooves 72 and 73 are formed substantially in parallel with each other, and the FPC 2 is bonded to the second face 92 of the recording element substrate 1 in the region between the grooves 72 and 73 by the adhesive agent 81. The grooves 72 and 73 each can have a length greater than the width W of the FPC 2. The groove closer to the liquid supply port primarily serves to prevent the adhesive agent 81 used to bond the FPC 2 and the recording element substrate 1 from flowing into the liquid supply path 15. The groove 73 closer to the end of the recording element substrate 1 primarily serves to prevent the electrical insulating sealant 90 covering the electric connection part from overflowing to the second face 92 of the recording element substrate 1 along the side edge part 30 of the FPC 2 and reaching the liquid supply port. Of course, the groove 73 serves also to prevent the adhesive agent 81 from adhering to any exposed wiring conductor 21 of the FPC 2.

An application amount $A_{adh}$ of the adhesive agent 81 used to bond the FPC 2 and the recording element substrate 1 and an application amount $A_{seal}$ of the sealant 90 used to cover the electric connection part including the bonding wires 51 are generally related according to $A_{seal} > A_{adh}$. That is, the application amount of the sealant 90 is greater than that of the adhesive agent 81. The greater the application amount, the more likely the applied substance is to be squeezed out or to overflow. Therefore, the groove 73 closer to the end of the recording element substrate 1 can have a larger volume than the groove 72 closer to the liquid supply port of the liquid supply path 15. Provided that, as illustrated in FIG. 14B, the width direction of the FPC 2 to be bonded is assumed as an X-direction, which coincides with the length direction of the grooves, and the direction perpendicular to the X-direction is assumed as a Y-direction, which coincides with the width direction of the grooves, the groove 73 has greater length and width than the groove 72 in the illustrated example. In the illustrated example, the grooves 72 and 73 have the same depth. However, the grooves may have different volumes by having different depths. In the illustrated example, the grooves 72 and 73 have a depth greater than the thickness of the applied adhesive agent 81 in order that the grooves 72 and 73 are not partially blocked by the adhesive agent 81. This is because, if the grooves 72 and 73 are blocked, even if partially, then air in the blocked part expands under the heat generated when the adhesive agent 81 sets, and can make the FPC 2 peel off or make the adhesive agent 81 burst. Peel-off of the FPC 2 leads to a defective product, and if the burst adhesive agent 81 blocks the liquid supply port, the adhesive agent 81 may interfere with the ejection of the liquid. The distance between the grooves 72 and 73 can be maximized in order to ensure the largest possible bonding area of the FPC 2 to increase the bonding strength Next, a process of assembly of the liquid ejection head according to this embodiment will be described. According to this embodiment, as in the second embodiment, first, the adhesive agent 81 is applied to the base film 25 of the FPC 2 to bond the FPC 2 and the recording element substrate 1 to each other as illustrated in FIG. 14C. In this process, the adhesive agent 81 is pressed and squeezed out between the FPC 2 and the recording element substrate 1. However, the adhesive agent 81 squeezed out flows into the grooves 72 and 73 and therefore does not flow into the liquid supply path 15. The pads 12 of the recording element substrate 1 and the wiring conductors 21 of the FPC 2 are then electrically connected to each other by wire bonding, and the electric connection part is covered with the electrical insulating sealant 90. The sealant 90 overflows to the second face 92 of the recording element substrate 1 along the side edge part 30 of the FPC 2 but flows in the groove 73 and is trapped there as illustrated in FIG. 14D. Therefore, the sealant 90 cannot flow into the liquid supply path 15.

Figure 15A:
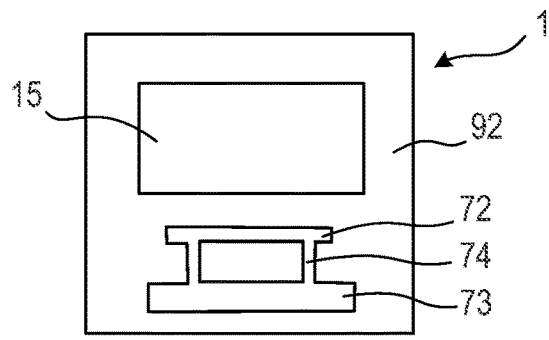
FIG. 15A is a diagram for illustrating another example of the recording element substrate.
Figures 15B, 15C:
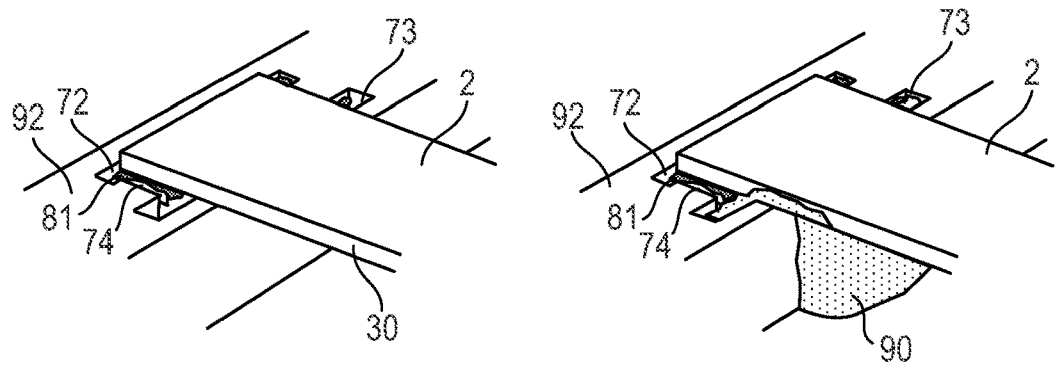
FIG. 15B is a diagram for illustrating the other example of the recording element substrate.
FIG. 15C is a diagram for illustrating the other example of the recording element substrate.

Although two grooves 72 and 73 are provided in the second face 92 of the recording element substrate 1 in the above description, three or more grooves may be provided by considering the bonding strength between the FPC 2 and the recording element substrate 1. As the number of grooves increases, the bonding area between the FPC 2 and the recording element substrate 1 decreases, and thus the bonding strength decreases, although the flowing and spreading of the adhesive 81 and the sealant 90 can be prevented with higher reliability. In the example described above, the grooves 72 and 73 each have an opening in an elongated rectangular shape on the second face 92 of the recording element substrate 1 and are separate from each other. Alternatively, the grooves 72 and 73 may be coupled by a coupling groove. FIGS. 15A to 15C are diagrams for illustrating an arrangement of the grooves 72 and 73 coupled to each other. FIG. 15A is a plan view of the second face 92 of the recording element substrate 1, FIG. 15B is a perspective view of the FPC 2 bonded to the recording element substrate 1, and FIG. 15C is a perspective view of the FPC 2 to which the sealant 90 is applied. A pair of coupling grooves 74 is provided to couple the grooves 72 and 73 to each other. The coupling grooves 74 can be positioned slightly outward from the side edges of the FPC 2 when the FPC 2 is bonded to the recording element substrate 1. Since the coupling grooves 74 coupling the grooves 72 and 73 to each other are provided, any adhesive agent 81 squeezed out between the FPC 2 and the recording element substrate 1 flows into the grooves 72 and 73 and coupling grooves 74 surrounding the bonded FPC 2 as illustrated in FIG. 15B, and thus the adhesive agent 81 squeezed out can be reliably prevented from overflowing to the liquid supply port. Besides, the sealant 90 having flowed to the second face 92 of the recording element substrate 1 can flow not only into the groove 73 and but also into the groove 72 through the coupling grooves 74 as illustrated in FIG. 15C. Therefore, compared with the case where the separate grooves 72 and 73 are provided, the sealant 90 can be more reliably prevented from reaching the liquid supply port of the liquid supply path 15.

Figure 16A:
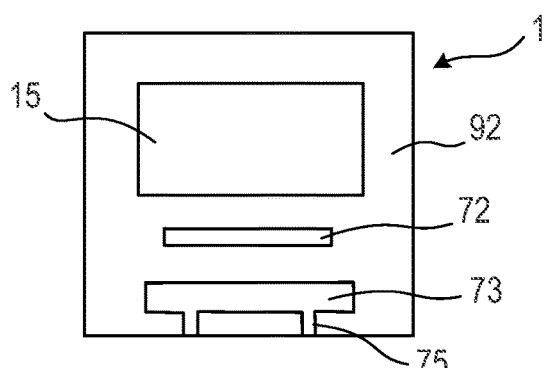
FIG. 16A is a diagram for illustrating a further example of the recording element substrate.
Figures 16B, 16C:
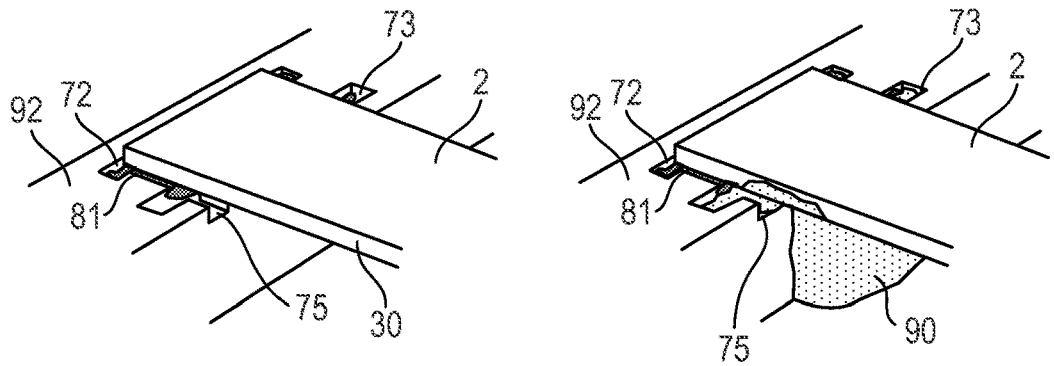
FIG. 16B is a diagram for illustrating the further example of the recording element substrate.
FIG. 16C is a diagram for illustrating the further example of the recording element substrate.

In the fourth embodiment, the shapes and arrangement of the grooves formed on the second face 92 of the recording element substrate 1 are not limited to those described above. FIGS. 16A to 16C illustrate another example of the shapes and arrangement of the grooves. FIG. 16A is a plan view of the second face 92 of the recording element substrate 1, FIG. 16B is a perspective view of the FPC 2 bonded to the recording element substrate 1, and FIG. 16C is a perspective view of the FPC 2 to which the sealant 90 is applied. The arrangement illustrated in FIGS. 16A to 16C is the same as the arrangement illustrated in FIGS. 14A to 14D except for a pair of end grooves 75 that extend from the groove 73 closer to the end of the recording element substrate 1 to the end of the recording element substrate 1. The end grooves 75 can be positioned slightly outward from the side edges of the FPC 2 when the FPC 2 is bonded to the recording element substrate 1. As illustrated in FIG. 16B, with the arrangement illustrated in FIGS. 16A to 16C, the adhesive agent 81 is prevented from being squeezed out in the same manner as that described above with reference to FIG. 13. Any sealant 90 overflowing along the side edge part of the FPC 2 is preferentially guided into the groove 73 by the end grooves 75, as illustrated in FIG. 16C. Therefore, even if the application amount of the sealant 90 accidentally increases, the increment of the sealant 90 can be more readily guided into the groove 73, and accordingly, the sealant 90 can be prevented from flowing into the liquid supply path 15 with higher reliability.

Figure 17A:
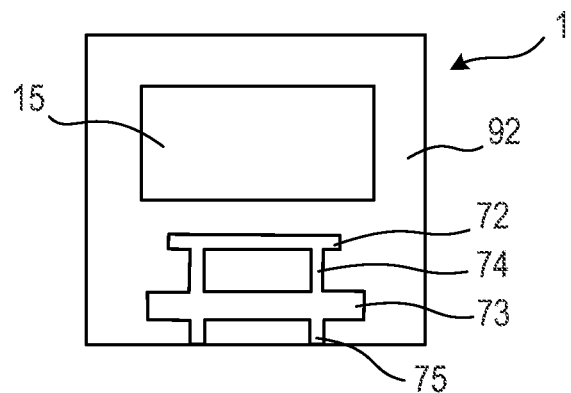
FIG. 17A is a diagram for illustrating a further example of the recording element substrate.
Figure 17B:
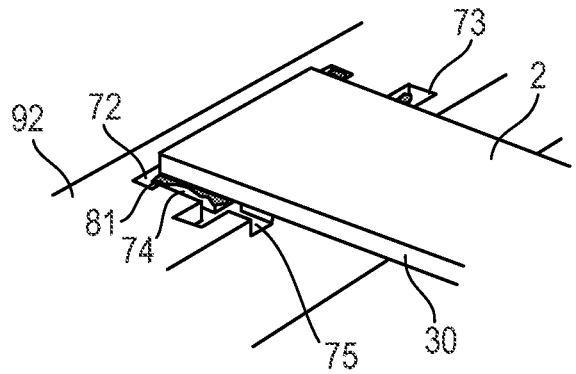
FIG. 17B is a diagram for illustrating the further example of the recording element substrate.
Figure 17C:
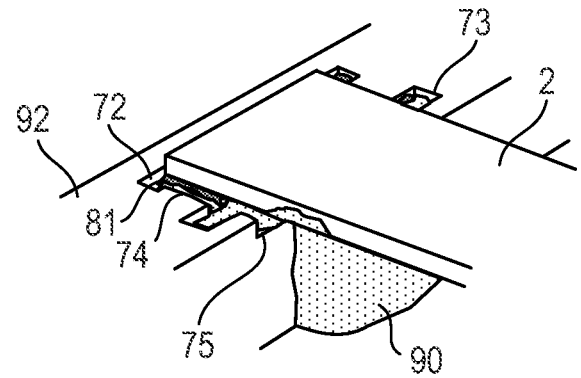
FIG. 17C is a diagram for illustrating the further example of the recording element substrate.

FIGS. 17A to 17C illustrate another example of the shapes and arrangement of the grooves. FIG. 17A is a plan view of the second face 92 of the recording element substrate 1, FIG. 17B is a perspective view of the FPC 2 bonded to the recording element substrate 1, and FIG. 17C is a perspective view of the FPC 2 to which the sealant 90 is applied. The arrangement illustrated in FIGS. 17A to 17C is a combination of the arrangement illustrated in FIGS. 15A to 15C and the arrangement illustrated in FIGS. 16A to 16C, and not only the pair of coupling grooves 74 coupling the grooves 72 and 73 to each other but also the pair of end grooves 75 extending from the groove 73 to the end of the recording element substrate 1 are provided. As illustrated in FIG. 17B, with the arrangement illustrated in FIGS. 17A to 17C, the adhesive agent 81 is prevented from being squeezed out in the same manner as that described above with reference to FIGS. 14A to 14D. With the arrangement illustrated in FIGS. 17A to 17C, the grooves for accommodating the sealant 90 have a greater volume than those illustrated in FIGS. 16A to 16C. Even if the application amount of the sealant 90 accidentally increases, any sealant 90 overflowing to the second face 92 can be guided into the grooves with reliability as illustrated in FIG. 17C, and the sealant 90 can be prevented from flowing into the liquid supply path 15 with reliability.

Figure 18A:
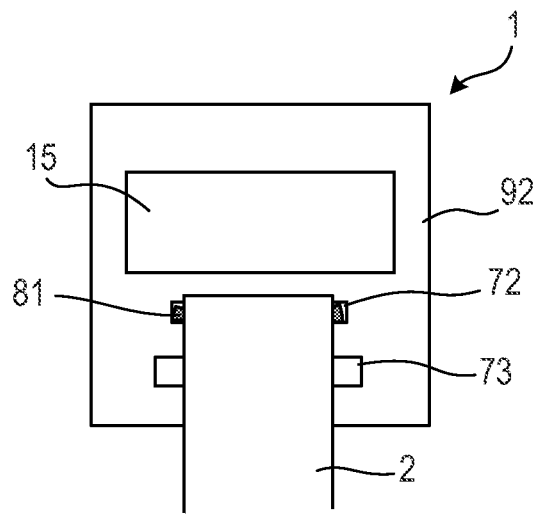
FIG. 18A is a diagram for illustrating a position of the FPC bonded to the recording element substrate.
Figure 18B:
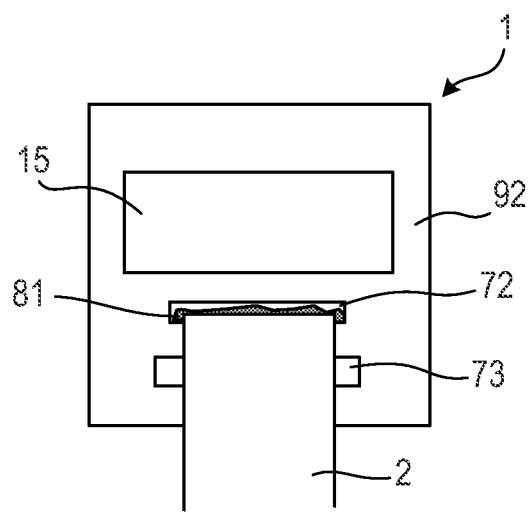
FIG. 18B is a diagram for illustrating another position of the FPC bonded to the recording element substrate.

Next, where on the recording element substrate 1 the FPC 2 should be bonded to the recording element substrate 1 in the fourth embodiment will be described with reference to FIGS. 18A and 18B. FIGS. 18A and 18B are plan views of the second face 92 of the recording element substrate 1 with the FPC 2 bonded thereto. If the leading end of the FPC 2 completely crosses the groove 72 closer to the liquid supply path 15 as illustrated in FIG. 18A, the adhesive agent 81 squeezed out and the FPC 2 may block the groove 72, and air in the blocked space may expand to cause the FPC 2 to peel off depending on the environmental condition. To avoid this, as illustrated in FIG. 18B, the leading end of the FPC 2 can be positioned not to completely cross the groove 72 closer to the liquid supply path 15.

Figure 19A:
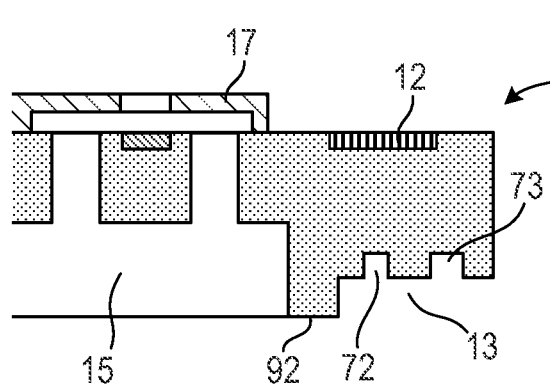
FIG. 19A is a diagram for illustrating a further example of the recording element substrate.
Figure 19B:
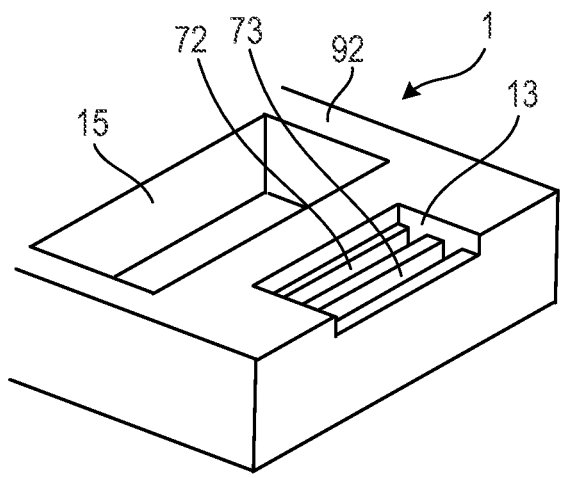
FIG. 19B is a diagram for illustrating the further example of the recording element substrate.

According to the fourth embodiment, as in the third embodiment described earlier, the recess part 13 for accommodating the FPC 2 can be provided in the second face 92 of the recording element substrate 1, in order to prevent the assembly of the recording element substrate 1 and the FPC 2 from being inclined with respect to the flow path member 7. FIGS. 19A and 19B are diagrams illustrating the recording element substrate 1 with the recess part 13 for accommodating the FPC 2 formed therein. FIG. 19A is a schematic cross-sectional view, and FIG. 19B is a perspective view of the second face 92. The grooves 73 and 74 are provided in the recess part 13. With the arrangement illustrated in FIGS. 19A and 19B, the overflow of the adhesive agent 81 and the sealant 90 can be prevented, and the surface of the base film 25 of the FPC 2 and the second face 92 of the recording element substrate 1 can be made substantially flush with each other.

In the fourth embodiment described above, the number, shapes and dimensions of the grooves formed in the second face of the recording element substrate 1 are not limited to those described above. The number, shapes and dimensions of the grooves can be appropriately chosen by considering the type, application amount, viscosity (susceptibility to overflow) and bonding strength of the adhesive agent 81 and sealant 90, for example.

Fifth Example Embodiment

Figure 20A:
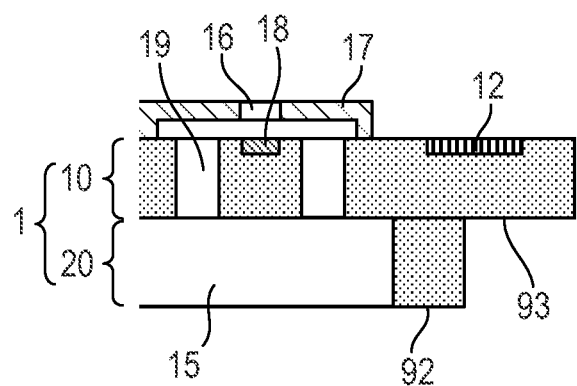
FIG. 20A is a diagram for illustrating a recording element substrate according to a fifth example embodiment.
Figure 20B:
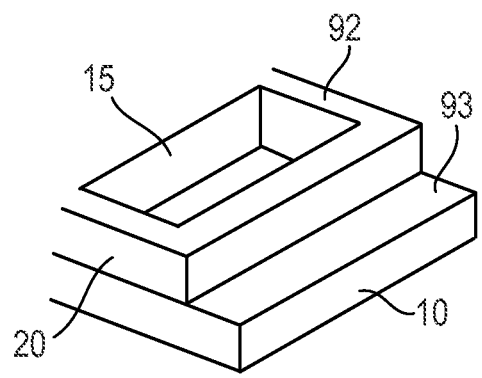
FIG. 20B is a diagram for illustrating the recording element substrate according to the fifth example embodiment.

Next, a fifth embodiment of the present disclosure will be described. FIGS. 20A and 20B are diagrams illustrating a recording element substrate 1 used in a liquid ejection head according to a fifth embodiment. FIG. 20A is a schematic cross-sectional view, and FIG. 20B is a perspective view of a second face 92 of the recording element substrate 1. The recording element substrate 1 according to this embodiment includes a first substrate 10 and a second substrate 20 bonded to each other, and the first substrate 10 includes a recording element 18 that produces energy required to eject a liquid and an ejection orifice forming member 17, and a liquid supply port of a liquid supply path 15 is formed in the second substrate 20. As with the ejection orifice forming member 17 described with regard to the first embodiment, an ejection orifice 16 is formed in the ejection orifice forming member 17. An upper surface of the first substrate 10 in FIG. 20A is a first face of the recording element substrate 1, and a lower face of the second substrate 20 in FIG. 20A is a second face 92 of the recording element substrate 1. A pad 12 for electric connection is also provided on the front surface of the first substrate 10. Separate supply paths 19 in communication with the liquid supply path 15 pass through the first substrate 10 in order to supply the liquid to the position of the recording element 18.

The first substrate 10 and the second substrate 20 can be bonded to each other by any of an adhesive agent and a bonding film. In the following description, a thermosetting epoxy adhesive agent is used to bond the first substrate 10 and the second substrate 20 to each other. The first substrate 10 and the second substrate 20 are both manufactured from a semiconductor wafer using a semiconductor device manufacturing technique. Typically, the recording element substrate 1 has a sufficiently smaller size than a semiconductor wafer. Therefore, a plurality of first substrates 10 can be manufactured at the same time from one semiconductor wafer, and a plurality of second substrates 20 can also be manufactured at the same time from one semiconductor wafer. Therefore, in the manufacture of the recording element substrate 1, the first substrate 10 and the second substrate 20 can be bonded to each other in two possible processes. In a first process, a wafer in which a plurality of substrates 10 is formed but yet to be separated and a wafer in which a plurality of second substrates 20 is formed but yet to be separated are bonded to each other, and then dicing is performed to separate the individual recording element substrates 1. In a second process, individual first substrates 10 are separated from a wafer for first substrates 10, and individual second substrates 20 are also separated from a wafer for second substrates 20, and then a single recording element substrate is formed by bonding one first substrate 10 and one second substrate 20 to each other. In this embodiment, any of the two processes can be used.

Figure 21A:
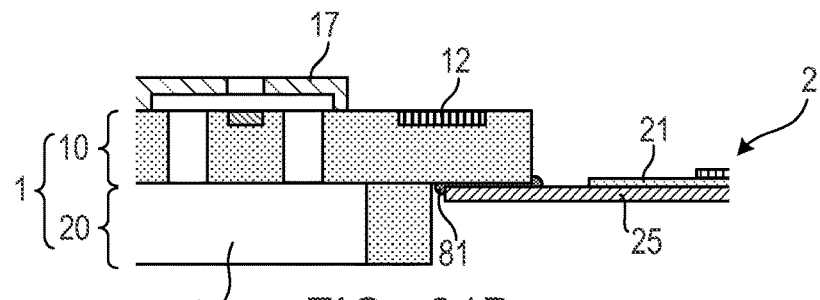
FIG. 21A is a diagram for illustrating bonding of the recording element substrate and the FPC.
Figure 21B:
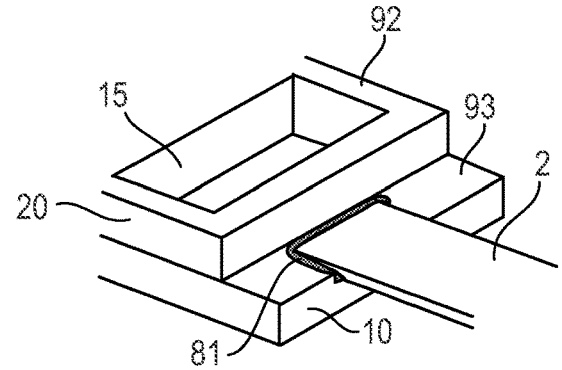
FIG. 21B is a diagram for illustrating the bonding of the recording element substrate and the FPC.

FIGS. 21A and 21B are diagrams for illustrating bonding of the recording element substrate 1 and the FPC 2 according to this embodiment. FIG. 21A is a schematic cross-sectional view, and FIG. 21B is a perspective view of the recording element substrate 1 viewed from the side of the second face 92. According to this embodiment, in order to prevent the adhesive agent 81 from flowing into the liquid supply path 15 when the FPC 2 is bonded to the second face 92 of the recording element substrate 1, the face of the first substrate 10 opposite to the first face is used as a bonding face 93 to be bonded to the FPC 2. Provided that the second face of the recording element substrate 1 is facing upward as illustrated in FIG. 21B, the bonding face 93 is positioned at a lower level than the opening, that is, the liquid supply port, of the liquid supply path 15 in the second substrate 20 by the thickness of the second substrate 20. That is, according to this embodiment, what is equivalent to the recess part 13 in the third embodiment described above is achieved by providing a level difference between the first substrate 10 and the second substrate 20. The adhesive agent is applied to the base film 25 of the FPC 2, and the FPC 2 is pressed against the recording element substrate 1 to bond the recording element substrate 1 and the FPC 2 to each other. Although the pressed adhesive agent 81 is squeezed out between the recording element substrate 1 and the FPC 2, the level difference between the bonding face 93 and the second face 92 prevents the adhesive agent 81 squeezed out from reaching the liquid supply port of the liquid supply path 15.

Figure 22A:
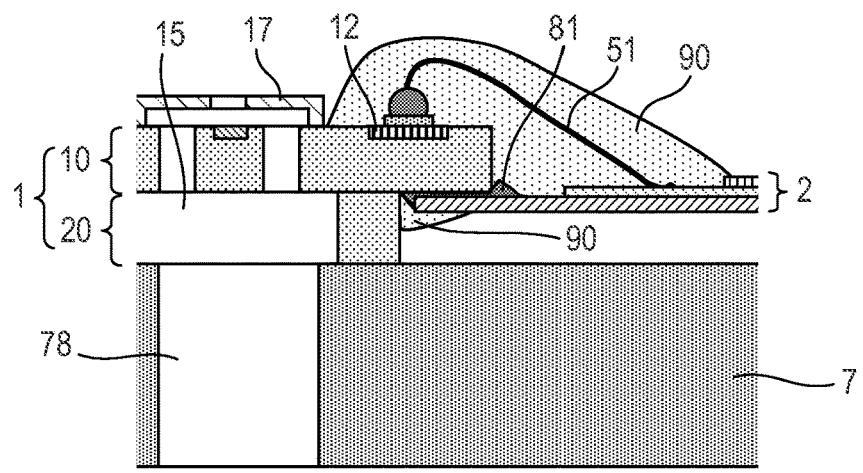
FIG. 22A is a diagram for illustrating a liquid ejection head according to the fifth example embodiment.
Figure 22B:
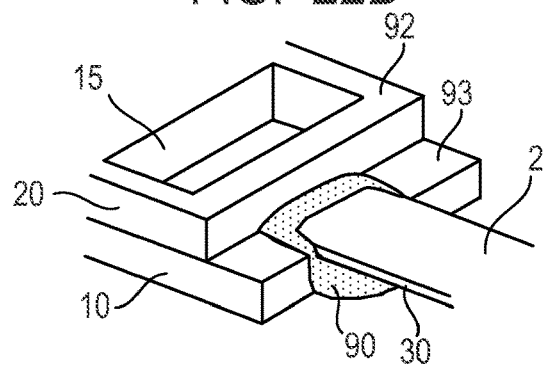
FIG. 22B is a diagram for illustrating the liquid ejection head according to the fifth example embodiment.

FIGS. 22A and 22B are diagrams illustrating the liquid ejection head according to the fifth embodiment. FIG. 22A is a schematic cross-sectional view, and FIG. 22B is a perspective view of the recording element substrate 1 with the flow path member 7 removed therefrom viewed from the side of the second face 92. As described above, after the recording element substrate 1 and the FPC 2 are mechanically bonded to each other, the pads 12 of the recording element substrate 1 and the wiring conductors 21 of the FPC 2 are electrically connected to each other by wire bonding. After the electric connection, the electric connection part including the bonding wires 51, the pads 12 of the recording element substrate 1 and any exposed wiring conductors 21 of the FPC 2 are covered with the electrically insulating sealant 90. Since the bonding wires 51 are completely coated and sealed with the sealant 90, the sealant 90 overflows to the bonding face 93 along the side edge part 30 of the FPC 2. With the arrangement according to this embodiment, since there is a significant level difference between the bonding face 93 of the first substrate 10 and the face of the second substrate 20 in which the opening of the liquid supply path 15 is formed, the overflowing sealant 90 is trapped by the step part formed by the level difference. Therefore, the arrangement according to this embodiment can prevent the sealant 90 from flowing into the liquid supply path 15. For example, the level difference between the bonding face of the first substrate 10 and the face of the second substrate 20 in which the opening of the liquid supply path 15 is formed is about 600 µm, and the thickness of the FPC bonded to the bonding face 93 is about 200 µm.

With the arrangement according to this embodiment, there is a level difference of about 400 µm between the surface of the base film 25 of the FPC 2 and the face of the second substrate 20 in which the opening of the liquid supply path 15 is formed, for example. By increasing the level difference, variations of the value of a property, such as viscosity, of the sealant 90 can be readily accommodated. The value of the level difference between the bonding face 93 of the first substrate 10 and the face of the second substrate 20 in which the opening of the liquid supply path 15 is formed is not limited to the value described herein. The value of the level difference can be appropriately set by considering other level differences formed in the recording element substrate 1 and the thickness of the FPC 2.

Figure 23A:
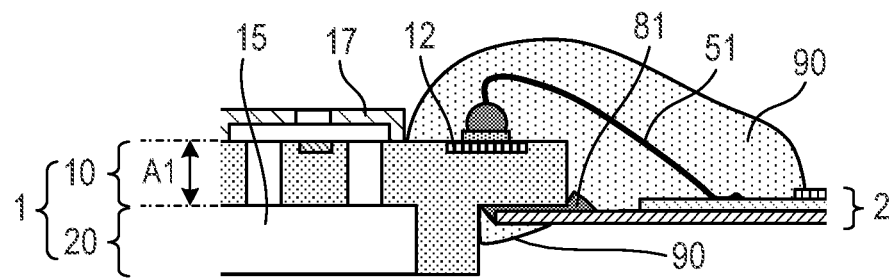
FIG. 23A is a diagram for illustrating another example of the liquid ejection head according to the fifth example embodiment.
Figure 23B:
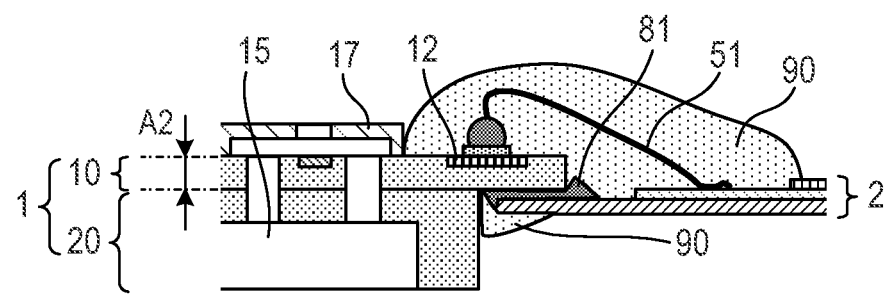
FIG. 23B is a diagram for illustrating the other example of the liquid ejection head according to the fifth example embodiment.

FIGS. 23A and 23B are schematic cross-sectional views illustrating other examples of the liquid ejection head according to the fifth embodiment, in which the total thickness of the recording element substrate 1 is fixed, and the first substrate 10 has different thicknesses. The first substrate 10 has a thickness A1 in the example illustrated in FIG. 23A and a thickness A2 in the example illustrated in FIG. 23B (where A1>A2). By reducing the thickness of the first substrate 10, the level difference between the apex of the bonding wire 51 and the wiring conductor 21 of the FPC 2 can be reduced, and the required thickness of the sealant 90 applied can be reduced. As a result, the application amount of the sealant 90 can be reduced, and the amount of the sealant 90 overflowing to the bonding face 93 along the side edge part 30 of the FPC 2 can be reduced.

Figure 24:
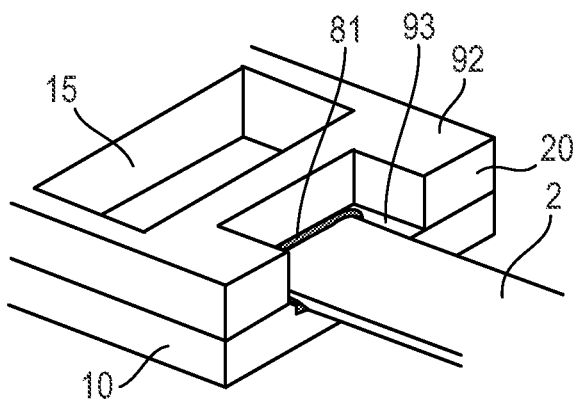
FIG. 24 is a diagram for illustrating a further example of the liquid ejection head according to the fifth example embodiment.

In the example illustrated in FIGS. 20A to 21B, the bonding face 93 is formed to connect the pair of opposite sides of the end part of the recording element substrate 1. However, the bonding face 93 is not limited to such a shape, and the bonding face 93 may be shaped to match the shape of the leading end part of the FPC 2 or to be slightly larger than the leading end part of the FPC 2. FIG. 24 is a perspective view of the recording element substrate 1 viewed from the side of the second face 92, illustrating the liquid ejection head with the bonding face 93 shaped to match the shape of the leading end part of the FPC 2. With the arrangement illustrated in FIG. 24, since the bonding face 93 is shaped to match the shape of the leading end part of the FPC 2, the leading end part of the FPC 2 is surrounded by side walls of the second substrate 20.

While the present disclosure has been described with reference to example embodiments, it is to be understood that the disclosure is not limited to the disclosed example embodiments. The scope of the following claims is to be accorded the broadest interpretation so as to encompass all such modifications and equivalent structures and functions.

This application claims the benefit of Japanese Patent Application No. 2019-080839, filed Apr. 22, 2019, which is hereby incorporated by reference herein in its entirety.

What is claimed is:

1. A liquid ejection head, comprising:
a flow path member having a flow path for supplying a liquid;
a recording element substrate including a pad for electric connection formed on a first face and a liquid supply port formed on a second face, which is opposite to the first face; and
a flexible electric wiring substrate including a wiring conductor,
wherein the recording element substrate is bonded to the flexible electric wiring substrate in at least a part of a region of the second face between the liquid supply port and an edge of the recording element substrate,
the liquid ejection head has an electric connection part in which the wiring conductor and the pad are electrically connected to each other by a bonding wire, and
the flexible wiring substrate is provided between the flow path member and the recording element substrate.

2. The liquid ejection head according to claim 1, wherein the flexible electric wiring substrate includes a base material and the wiring conductor formed on a first face of the base material, and
the second face of the recording element substrate and the first face of the base material are bonded to each other.

3. The liquid ejection head according to claim 1, wherein in a plan view of the liquid ejection head, the pad and a bonded region in which the recording element substrate and the flexible electric wiring substrate are bonded to each other at least partially overlap with each other.

4. The liquid ejection head according to claim 1, wherein the electric connection part is covered with an electrical insulating sealant.

5. The liquid ejection head according to claim 1, wherein the flexible electric wiring substrate is bonded to the recording element substrate at a face of a leading end part of the flexible electric wiring substrate that is parallel with a longitudinal direction of the flexible electric wiring substrate.

6. The liquid ejection head according to claim 5, wherein a tip end of the wiring conductor on the flexible electric wiring substrate is positioned in such a manner that the wiring conductor does not come into contact with the recording element substrate.

7. The liquid ejection head according to claim 5, wherein a ridge of the edge of the recording element substrate is notched at least in a part where the flexible electric wiring substrate crosses the edge of the recording element substrate.

8. The liquid ejection head according to claim 5, wherein a groove extending in a direction perpendicular to the longitudinal direction is formed on a surface of the recording element substrate in a bonded region where the recording element substrate and the flexible electric wiring substrate are bonded to each other.

9. The liquid ejection head according to claim 8, wherein a length of the groove is greater than a width of the flexible electric wiring substrate in the direction perpendicular to the longitudinal direction.

10. The liquid ejection head according to claim 8, wherein the flexible electric wiring substrate is bonded to the recording element substrate in such a manner that a leading end of the flexible electric wiring substrate does not block the groove closest to the liquid supply port.

11. The liquid ejection head according to claim 8, wherein the liquid ejection head has a plurality of the grooves that are parallel with each other.

12. The liquid ejection head according to claim 11, wherein the farther the groove is from the liquid supply port, the larger the volume of the groove is.

13. The liquid ejection head according to claim 1, wherein a recess part that is to be connected to the edge of the recording element substrate is formed in a part of the second face, and the flexible electric wiring substrate is bonded to the recording element substrate in the recess part.

14. The liquid ejection head according to claim 1, wherein the recording element substrate includes a first substrate and a second substrate bonded to each other, the first substrate including the first face and having the pad formed thereon, and the second substrate including the second face and having the liquid supply port formed therein.

15. The liquid ejection head according to claim 14, wherein a part of a face of the first substrate opposite to the first face is not covered by the second substrate and is bonded to the flexible electric wiring substrate.

* * * * *